(12) United States Patent
Patten

(10) Patent No.: US 7,944,304 B1
(45) Date of Patent: May 17, 2011

(54) HIGH EFFICIENCY MILLIMETER WAVE FIELD-EFFECT TRANSISTOR (FET) AMPLIFIER WITH COUPLED LINE MATCHING NETWORK

(75) Inventor: Scott L. Patten, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 45 days.

(21) Appl. No.: 12/455,824

(22) Filed: Jun. 8, 2009

(51) Int. Cl.
*H03F 3/16* (2006.01)
(52) U.S. Cl. ........................................ 330/277; 330/302
(58) Field of Classification Search .................. 330/302, 330/305–306, 277
See application file for complete search history.

(56) References Cited

U.S. PATENT DOCUMENTS

| | | | | |
|---|---|---|---|---|
| 6,028,485 A | * | 2/2000 | Sigmon et al. | 330/295 |
| 6,111,477 A | * | 8/2000 | Klymyshyn et al. | 333/139 |
| 7,714,664 B2 | * | 5/2010 | Kanaya et al. | 330/311 |

OTHER PUBLICATIONS

Raab, Frederick H,; "An Introduction to Class-F Power Amplifiers"; RF Design, May 1996, pp. 79-84, vol. 19, No. 5, and Jul. 1996, p. 14, vol. 19, No. 7; Green Mountain Radio Research Compnay, Colchester, Vermont, U.S.A.

* cited by examiner

*Primary Examiner* — Hieu P Nguyen
(74) *Attorney, Agent, or Firm* — Matthew J. Evans; Daniel M. Barbieri

(57) ABSTRACT

The present invention is a system for providing an optimal power match to an output of an amplifier using a matching network. The system may include a Field-Effect Transistor (FET) amplifier and a load. The system may further include a coupled line matching network connected to and between the FET amplifier and the load. The coupled line matching network may be configured for providing an optimal power match to the FET amplifier in the K band of operation.

18 Claims, 2 Drawing Sheets

US 7,944,304 B1

HIGH EFFICIENCY MILLIMETER WAVE FIELD-EFFECT TRANSISTOR (FET) AMPLIFIER WITH COUPLED LINE MATCHING NETWORK

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of FA8650-07-A4501 awarded by Air Force Research Laboratory (AFRL).

FIELD OF THE INVENTION

The present invention relates to the field of advanced radio systems and particularly to a high efficiency millimeter wave field-effect transistor (FET) amplifier with a coupled line matching network and method for implementing same.

BACKGROUND OF THE INVENTION

Current power amplifiers may not provide a desired level of performance.

Thus, it would be desirable to provide a power amplifier which obviates problems associated with current power amplifiers.

SUMMARY OF THE INVENTION

Accordingly, an embodiment of the present invention is directed to a system, including: an amplifier; a coupled line matching network, the coupled line matching network being connected to the amplifier; and a load, the load being connected to the coupled line matching network, wherein the matching network is configured for matching an output provided by the amplifier to a power target.

An additional embodiment of the present invention is directed to a system, including: a Field-Effect Transistor (FET) amplifier; a coupled line matching network, the coupled line matching network being connected to the FET amplifier; and a load, the load being connected to the coupled line matching network, wherein the matching network is configured for matching an output provided by the FET amplifier to a power target.

An additional embodiment of the present invention is directed to a method for providing power matching/impedance matching, including: receiving an input signal at a Field-Effect Transistor (FET) amplifier; amplifying the input signal via the FET amplifier; providing the amplified input signal as an output via the FET amplifier; matching a first harmonic of the FET amplifier output and a third harmonic of the FET amplifier output to a power target via a coupled line matching network; and shorting a second harmonic of the FET amplifier output.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Efficiency of a number of power amplifiers may be limited. For example, a number of Class A amplifiers, Class AB amplifiers and Class B amplifiers may implement a conglomeration of series transmission lines and shunt/series capacitors to achieve impedance transformation. The above-mentioned Class A, Class AB and Class B amplifier designs may target only a fundamental frequency and may be limited in maximum efficiency. For example, the above-mentioned Class A, Class AB and Class B amplifiers may have efficiencies of less than thirty-five percent (35%) for frequencies above X band (ex.—X band may include frequencies ranging from approximately 7 to 12 Gigahertz (GHz)). Further, for $K_u$ band/Ku band frequencies (ex.—$K_u$ band/Ku band may include frequencies ranging from approximately 12 to 18 GHz), efficiency of the above-referenced Class A power amplifiers, Class AB power amplifiers and Class B power amplifiers may be as low as fifteen percent (15%).

Higher efficiency modes/power amplifier designs, such as Class D and Class E, may not translate well to the above-mentioned frequencies because of parasitics not allowing for switching. Also, Class F amplifier designs may be difficult to realize because they may have to control the impedance at many frequencies. This may square up the waveform, thereby maximizing voltage swing at odd harmonics and minimizing voltage swing at even harmonics. Shunt stubs may be added at each desired frequency in which impedance may need to be optimized. However, shunt stubs may be parasitic and may introduce dissipative loss to a network. Effectiveness at shorting even harmonics may be limited because it may be that the shunt stubs cannot be placed close enough to a transistor to provide a good short.

The system(s) and method(s) of the present invention may provide an amplifier(s) which has an efficiency greater than fifty percent (50%) for K band frequencies and beyond/frequencies up through K band (ex.—K band may include frequencies ranging from approximately 18 to 27 Gigahertz (GHz)). Further, the system(s) and method(s) of the present invention may also provide an amplifier(s) which has an efficiency level of greater than fifty percent (50%) for $K_u$ band frequencies (ex.—approximately 12-18 GHz).

Figure 1:
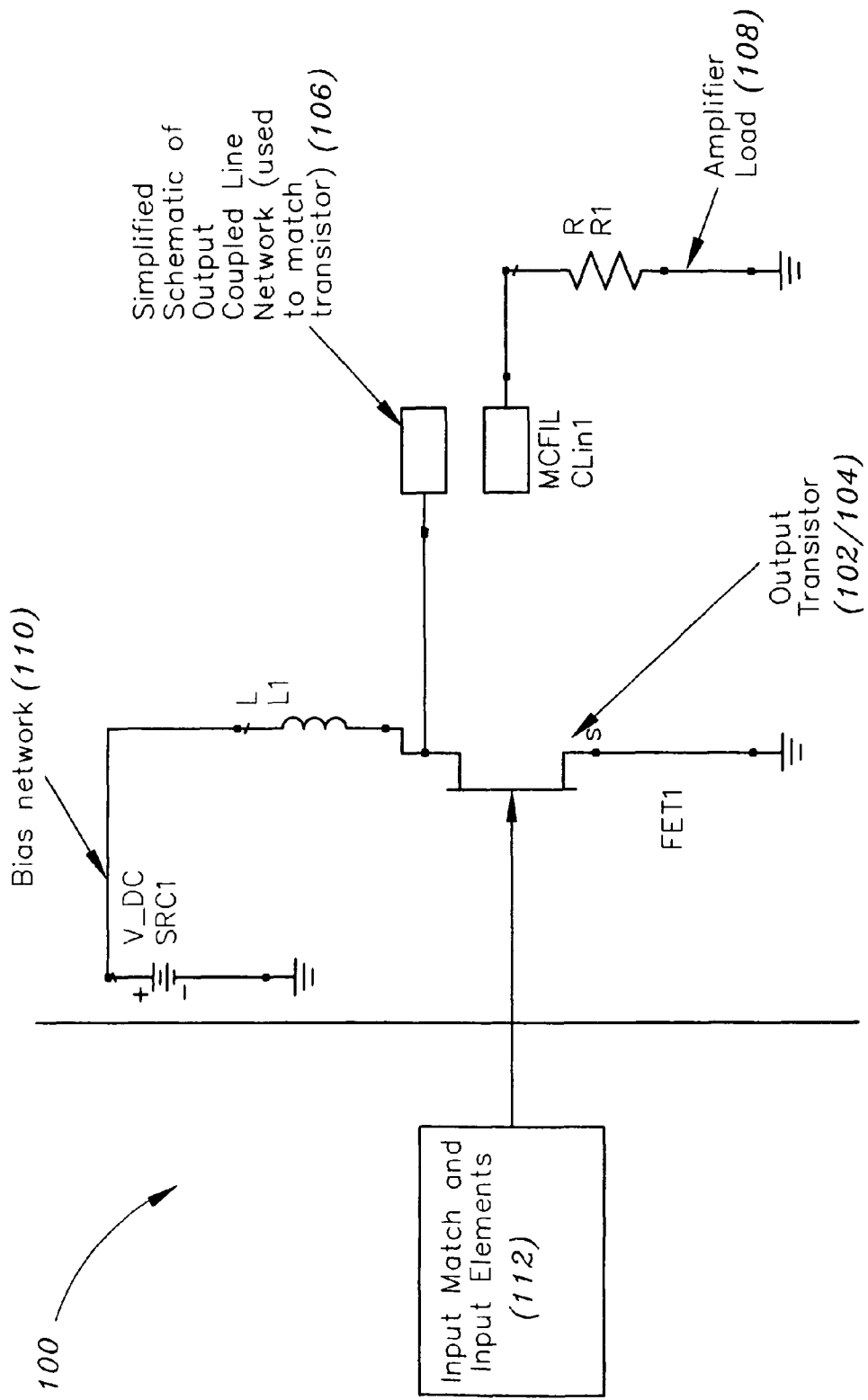
FIG. 1 is a block diagram schematic of a system including a high efficiency millimeter wave field-effect transistor (FET) amplifier with a coupled line matching network in accordance with an exemplary embodiment of the present invention.

Referring to FIG. 1, a system in accordance with an exemplary embodiment of the present invention is shown. In the illustrated embodiment, the system 100 includes an amplifier 102. In current embodiments of the present invention, the amplifier 102 may be a transistor amplifier, such as a Field-Effect Transistor amplifier (a FET amplifier 102) which may include/may implement an output transistor, such as a Field-Effect Transistor (FET)/FET transistor/FET device 104 to perform amplification. In further embodiments, the FET amplifier 102 is a high efficiency, millimeter wave FET amplifier 102. In still further embodiments, the FET 104 may, for example, be a Gallium Arsenide FET (GaAs FET), a Gallium Nitride FET, or the like. In alternative embodiments, the transistor/transistor device(s) implemented in the transistor amplifier may be a bipolar transistor.

In current embodiments of the present invention, the system 100 may further include a coupled line matching network/coupled line filter/coupled line/output coupled line network/a Microstrip Coupled-Line Filter section (MCFIL)/a line matching network 106. Further, in the system 100 of the present invention, the coupled line matching network 106 may be connected to the FET amplifier 102.

In exemplary embodiments of the present invention, the system 100 may further include a load/load device 108. Further, in the system of the present invention, the coupled line matching network 106 may be connected to the load 108. (ex.—load may be equal to 50 ohms). In current embodiments of the present invention, the coupled line matching network 106 may be connected to both the FET amplifier 102 and the load 108, such that said matching network 106 is connected between the FET amplifier 102 and the load 108.

In current embodiments of the present invention, the matching network 106 may be a quarter wave coupled line matching network 106 at the frequency of operation, said matching network being configured for matching an output of the FET amplifier 102/FET 104/matching an output of the FET amplifier 102/FET 104 to an optimal power target/presenting near optimal impedances to an output of the FET amplifier 102/providing impedance transformation for an output of the FET amplifier 102/matching harmonics of an output of the FET amplifier 102 to an optimal power target.

In exemplary embodiments of the present invention, the matching network 106 may, for instance, be configured for matching the first three harmonics of the FET amplifier output/FET output/FET amplifier output signal. In current embodiments of the present invention, a first harmonic of the FET amplifier output and a third harmonic of the FET amplifier output may be matched to the optimal power target. In further embodiments, adjusting width and line spacing of the two lines of the coupled line matching network 106 may allow said network 106 to provide correct impedance transformation at the first and third harmonic. In further embodiments, such as in embodiments where the matching network 106 is a quarter wave matching network 106, a second harmonic of the FET amplifier output may be shorted. By matching the harmonics of the FET amplifier output as described above, the matching network 106 of the system 100 may shape the FET amplifier output/may shape the FET amplifier output signal/may provide waveform shaping for a waveform of the FET amplifier output in a manner which may promote improved efficiency for the amplifier 102 of the present invention over the efficiencies provided by currently available/traditional Class A, Class AB and Class B amplifier designs. For example, the system 100 of the present invention may allow the amplifier 102 to demonstrate fifty percent (50%) power added efficiency or greater at $K_u$ band/Ku band. Thus, in the system 100 of the present invention, the coupled line network 106 may provide an optimal/near optimal power match to the FET amplifier 102/FET transistor 104, for instance, in the K band operation/at K band frequencies of operation, to promote improved amplifier efficiency as described above. Further, the above-referenced advantages of the present invention may be realized by implementing a small, low-loss single element coupled line matching network 106.

In further embodiments, the system 100 of the present invention may include a bias network 110. The bias network/biasing circuit 110 may be connected to the FET amplifier 102 and may be configured for applying a bias voltage to the transistor/FET 104 of the FET amplifier 102 for promoting correct/efficient operation of the FET amplifier 102. In additional embodiments, the system 100 of the present invention may include an input match/input matching circuit 112, which may include input elements, said input matching circuit 112 being connected to the FET amplifier 102.

The coupled line matching network 106 of the system 100 of the present invention may scale well with frequency, unlike many other high-efficiency techniques. Further, the coupled line 106 of the system 100 of the present invention may scale with periphery of the FET 104/FET amplifier 102 and consequently, may also scale with the output power of the FET amplifier 102. When implemented in the system 100 of the present invention, the coupled line matching network 106 may provide at least ten percent (10%) bandwidth. Further, the coupled line matching network 106, when implemented in the system 100 of the present invention, may provide an inherent Direct Current (DC) block to output network, thereby alleviating the need for Metal Insulator Metal capacitors (MIM caps).

In exemplary embodiments of the system 100 of the present invention, the FET amplifier 102 may provide greater than fifty percent (50%) drain efficiency from 14-15 GHz at a 28 dBm $P_{out}$ level. In further embodiments, a five Watt (5 W) version of the amplifier 102 of the present invention may provide greater than fifty percent (50%) power amplifier efficiency (ex.—for a two-stage version of the amplifier). Similar performance may be provided at 20 W. In further embodiments, the system 100 of the present invention may be implemented in Mini Common Data Link (CDL) devices. Still further, the use of the high efficiency amplifier 102 of the present invention may considerably reduce power amplifier size, weight and power (PA SWAP) above X band. Improving efficiency of the amplifier 102 to 50% may reduce prime power by a factor of at least 2, and may correspondingly reduce heat sink weight and size.

Figure 2:
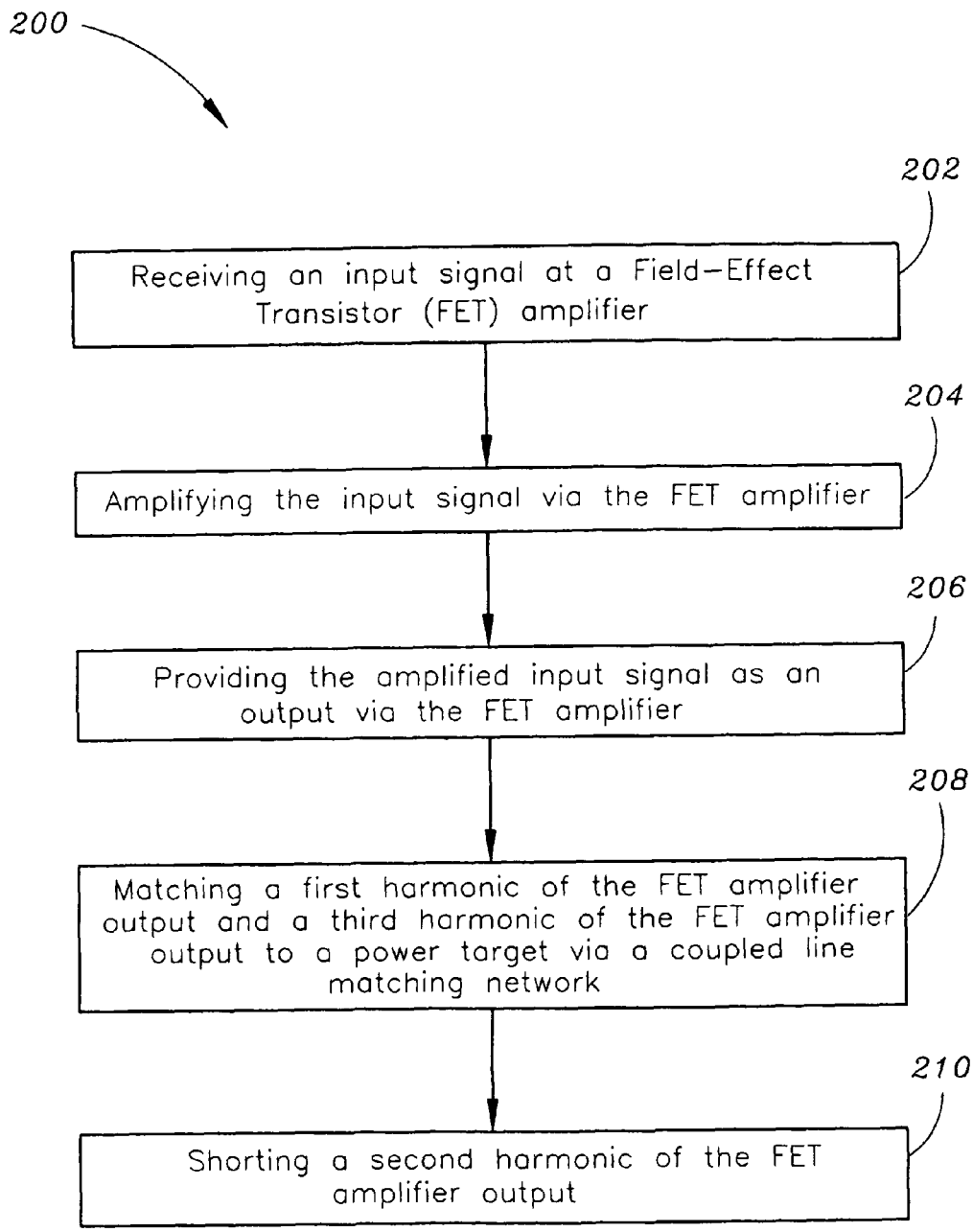
FIG. 2 is a flowchart illustrating a method for implementing the system shown in FIG. 1 in accordance with an exemplary embodiment of the present invention.

FIG. 2 is a flowchart illustrating a method for providing impedance transformation/power matching, such as via the system 100 described above, in accordance with an exemplary embodiment of the present invention. The method 200 may include the step of receiving an input signal at an amplifier, such as a transistor amplifier (ex.—a FET amplifier) 202. The method 200 may further include the step of amplifying the input signal via the FET amplifier 204. The method 200 may further include the step of providing the amplified input signal as an output via the FET amplifier 206. The method 200 may further include matching a first harmonic of the FET amplifier output and a third harmonic of the FET amplifier output to a power target via a coupled line matching network 208. The method 200 may further include shorting a second harmonic of the FET amplifier output 210.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A system, comprising:
   an amplifier;
   a coupled line matching network, the coupled line matching network being connected to the amplifier; and
   a load, the load being connected to the coupled line matching network,
   wherein the matching network is configured for matching an output provided by the amplifier to a power target,
   wherein a first harmonic of the amplifier output and a third harmonic of the amplifier output are matched to the power target.

2. A system as claimed in claim 1, wherein the amplifier is a transistor amplifier.

3. A system as claimed in claim 2, wherein the transistor amplifier is a Field-Effect Transistor (FET) amplifier.

4. A system as claimed in claim 1, wherein the amplifier is a millimeter wave amplifier.

5. A system as claimed in claim 1, wherein the coupled line matching network is a quarter wave coupled line matching network.

6. A system as claimed in claim 1, wherein a second harmonic of the amplifier output is shorted.

7. A system, comprising:
   a Field-Effect Transistor (FET) amplifier;
   a coupled line matching network, the coupled line matching network being connected to the FET amplifier; and
   a load, the load being connected to the coupled line matching network,
   wherein the matching network is configured for matching an output provided by the FET amplifier to a power target,
   wherein the coupled line matching network is further configured for providing correct impedance transformation at a first harmonic of the FET amplifier output and at a third harmonic of the FET amplifier output.

8. A system as claimed in claim 7, wherein a frequency of operation for the system is a K band frequency.

9. A system as claimed in claim 7, wherein the FET amplifier is a Gallium Arsenide FET amplifier.

10. A system as claimed in claim 7, wherein the FET amplifier is a Gallium Nitride FET amplifier.

11. A system as claimed in claim 7, further comprising:
    a bias network, the bias network being connected to the FET amplifier, the bias network being configured for applying a bias voltage to a FET of the FET amplifier for promoting correct operation of the FET amplifier.

12. A system as claimed in claim 7, further comprising:
    an input matching circuit, the input matching circuit including input elements, the input matching circuit being connected to the FET amplifier.

13. A system as claimed in claim 7, wherein the coupled line matching network is further configured for shorting a second harmonic of the amplifier output.

14. A method, comprising:
    receiving an input signal at a transistor amplifier;
    amplifying the input signal via the transistor amplifier;
    providing the amplified input signal as an output via the transistor amplifier; and
    matching a first harmonic of the transistor amplifier output and a third harmonic of the transistor amplifier output to a power target via a coupled line matching network.

15. A method as claimed in claim 14, further comprising:
    shorting a second harmonic of the transistor amplifier output.

16. A method as claimed in claim 14, wherein the transistor amplifier is a millimeter wave transistor amplifier.

17. A method as claimed in claim 14, wherein the transistor amplifier is a Field-Effect Transistor (FET) amplifier.

18. A method as claimed in claim 14, wherein width and line spacing of two lines included in the coupled line matching network are adjustable for providing correct impedance transformation at the first harmonic and the third harmonic of the transistor amplifier output.

* * * * *